United States Patent [19]

Moriya

[11] 4,193,125
[45] Mar. 11, 1980

[54] READ ONLY MEMORY

[75] Inventor: Yoshiaki Moriya, Inagi, Japan

[73] Assignee: Tokyo Shibaura Denki Kabushiki Kaisha, Japan

[21] Appl. No.: 964,430

[22] Filed: Nov. 28, 1978

[30] Foreign Application Priority Data

Dec. 2, 1977 [JP] Japan .................................. 52/144871

[51] Int. Cl.² .......................................... G11C 11/40
[52] U.S. Cl. ................................... 365/104; 365/51;
307/238
[58] Field of Search ............ 365/51, 103 SC, 104 TR,
365/182; 307/238, 279

[56] References Cited

U.S. PATENT DOCUMENTS 3,702,466  11/1972  Nakagiri et al. ........................ 365/51

Primary Examiner—Terrell W. Fears

Attorney, Agent, or Firm—Finnegan, Henderson, Farabow, Garrett & Dunner

[57] ABSTRACT

A read only memory comprises a P-type substrate and a plurality of N+-type diffusion layers arranged checkerwise on one major surface of the substrate in which four N+-type diffusion layers having contacts are located at corners of an imaginary rectangle, and a fifth N+-type region having a contact is formed substantially at the center of the imaginary rectangle. Between the fifth N+-type diffusion layer and the first to fourth N+-type diffusion layers four MOS transistors are formed for the single contact. Gate lines are provided, each extending between adjacent two N+-type diffusion layers without overlapping them. Each of the four N+-type diffusion layers also acts as a central N+-type region of another imaginary rectangle adjacent to the first mentioned imaginary rectangle.

9 Claims, 17 Drawing Figures

F I G. 5A
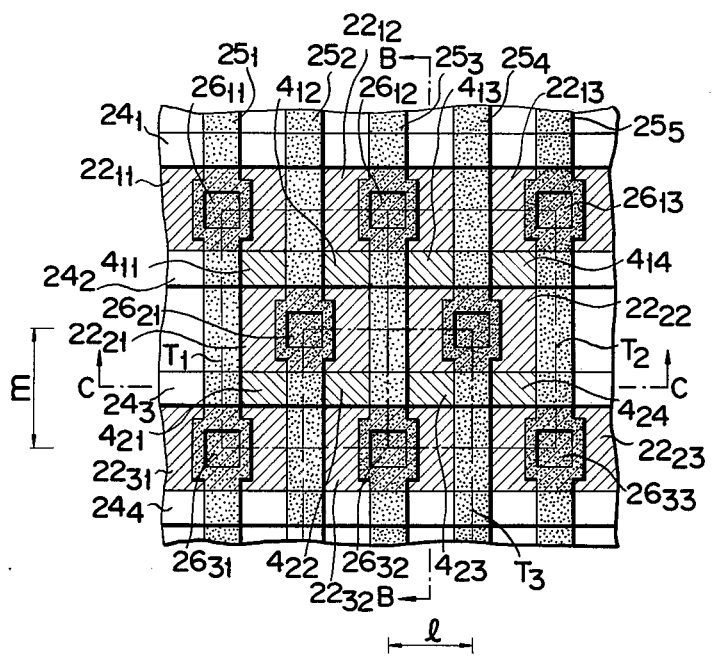
F I G. 5B
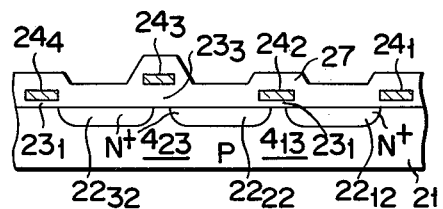
F I G. 5C
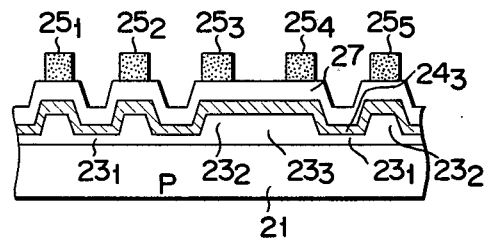

READ ONLY MEMORY

BACKGROUND OF THE INVENTION

This invention relates to a read only memory (ROM) using MOS transistors as memory cells.

A read only memory using MOS transistors can be proposed as is shown in FIG. 1A. The MOS transistors arranged in such pattern constitute a so-called "silicon gate type MOS IC". The cross sections of the MOS IC taken along line B—B, line C—C and line D—D are shown in FIGS. 1B, 1C and 1D, respectively.

The read only memory of FIGS. 1A to 1D comprises gate lines $1a$, $1b$, $1c$, ..., ROM output lines $2a$, $2b$, $2c$, ..., ground lines $3a$, $3b$, ..., MOS transistors $4_{11}$, $4_{12}$, $4_{13}$, ..., $4_{33}$, a P-type silicon substrate 5, N$^+$-type diffusion layers $6a$, $6b$, $6c$, ..., contacts $7a$, $7b$, $7c$, ... provided on the ROM output lines $2a$, $2b$, ..., gate oxide films $8_{1a}$, $8_{1b}$, $8_{1c}$, ... field oxide films $8_{2a}$, $8_{2b}$, $8_{2c}$, ... On one major surface of the P-type silicon substrate 5 each ground line is juxtaposed with two gate lines. For example, the ground line $3a$ is juxtaposed with the gate lines $1b$ and $1c$, and the ground line $3b$ with the gate lines $1d$ and $1e$. The ROM output lines $2a$, $2b$, ... intersect with the gate lines $1a$, $1b$, ... and the ground lines $3a$, $3b$, ... The ground lines $3a$, $3b$, ... are formed by N$^+$ impurity diffusion. Thus the MOS transistors $4_{11}$, $4_{12}$, ... are formed in the hatched areas in FIG. 1A, each constituted by adjacent ground line, N$^+$-type diffusion layer and gate line. The ground lines $3a$, $3b$, ... constitute the sources of the MOS transistors $4_{11}$ to $4_{33}$, and the N$^+$-type diffusion layers $6a$, $6b$, ... the drains thereof.

The ROM of FIGS. 1A to 1D is disadvantageous in that its 1-bit memory cell indicated by double dot-dash line occupies a relatively large areas. As commonly known, the contacts $7a$, $7b$, ... must occupy an area $1a$ larger than necessary. Otherwise the yield of the IC products cannot be maintained above a certain level. It is also known that the IC density of ROMs of this type depends largely on the size of contacts. In the ROM of FIGS. 1A to 1D the contacts $7a$, $7b$, ... arranged parallel to one another at regular intervals are extending in the lateral direction of the MOS IC. The MOS IC is therefore elongated in the lateral direction. Moreover, the contacts $7a$, $7b$, ... are not so frequently used since each contact is located between only two MOS transistors which extend in the longitudinal direction of the MOS IC along the ROM output lines $2a$, $2b$, ... For these reasons, the area S occupied by one 1-bit memory cell is:

$$S = l \times m = 20 \ \mu m \times 17 \ \mu m = 340 \ \mu m^2.$$

340 $\mu m^2$ is an extremely large area for a 1-bit memory cell, and the MOS IC cannot have a large IC density.

The ROM of FIGS. 1A to 1D has such a circuit structure as illustrated in FIG. 2, wherein the same parts are denoted by the same reference numerals as used in FIGS. 1A to 1D.

Another ROM using MOS transistors can be proposed as is illustrated in FIGS. 3A, 3B and 3C. In this ROM the output lines act also as ground lines. To read out data from a memory cell (i.e. MOS transistor) via a selected one of the output lines, a switching circuit is so operated as to connect to the ground the output line which is adjacent to the selected output line. The ROM comprises gate lines $1a$, $1b$, $1c$, ..., output lines $2a$, $2b$, $2c$, ..., memory cells $4_{11}$ to $4_{32}$, a P-type silicon substrate 5, gate oxide films $8_1$ and field oxide films $8_2$ ... The ROM has such a circuit structure as shown in FIG. 4A. As illustrated in FIG. 4A, the switching among the output lines $2a$, $2b$, $2c$, ... is carried out by a switching circuit 11.

Another known ROM using MOS transistors is illustrated in FIG. 4B. This ROM is identical with the ROM shown in FIG. 3A with respect to ROM section 4. It is characterized in that four output lines $2a$, $2b$, $2c$ and $2d$ form one group and are so connected to the ROM section 4 as to obtain the outputs of the ROM section. Suppose the output line $2a$ connected to an MOS transistor $12a$ is selected. Then, an MOS transistor $12e$ connected to the output line $2b$ adjacent to the selected line $12a$ is driven at once by an output of a switching circuit such as one 11 shown in FIG. 4A. In this case the output line $2b$ acts as a ground line. When the output line $2d$ connected to an MOS transistor $12d$, for example, is selected, an MOS transistor $12h$ connected to an output line $2e$ of the next group is driven immediately by an output of the switching circuit. In this case the output line $2e$ acts as a ground line. Since only one of the output lines of each group is selected at a time, one of the remaining output lines is used as a ground line.

Indeed the ROMs of FIGS. 4A and 4B have a little higher IC density than the ROM of FIGS. 1A to 1D. But their cost is inevitably high for their structures. That is, the gate lines $1a$, $1b$, $1c$, ... made by polysilicon extend in the lateral direction of the MOS IC, while the output lines (or diffusion layers) $2a$, $2b$, $2c$, ... extend in the longitudinal direction of the MOS IC. Between any two adjacent output lines a plurality of MOS transistors are formed. Apparently, the gate lines $1a$, $1b$, $1c$, ... which intersect with the N$^+$-type diffusion layers $2a$, $2b$, $2c$, ... make masks for forming the N$^+$-type diffusion layers $2a$, $2b$, $2c$, ... As a result, it becomes impossible to simultaneously achieve N$^+$ impurity diffusion for forming the MOS transistors $4_{11}$ to $4_{33}$ and N$^+$ impurity diffusion for forming the output lines $2a$, $2b$, $2c$, ... Thus, N$^+$ impurity must diffused two times, first to form the MOS transistors and then to form the output lines. This increase of impurity diffusion processes is one of the causes for cost hike.

SUMMARY OF THE INVENTION

An object of this invention is to provide a read only memory which has an elevated IC density and which is manufactured by less impurity diffusion processes and thus at a reduced cost.

This invention aims to improve such an ROM as shown in FIG. 4A wherein one of the output lines is selected by a switching circuit so as to read data and the other output line adjacent to the selected one acts as a ground line.

A read only memory according to this invention comprises a semiconductor substrate of one conductivity type and a plurality of MOS transistor blocks formed on one major surface of the substrate. Each MOS transistor block comprises first, second, third and fourth regions of the opposite conductivity type which are formed at four corners of an imaginary rectangle; a fifth region of the opposite conductivity type which is formed substantially at the center of the rectangle and spaced from the first, second, third and fourth regions; a first gate conductor which is laid on a gate insulation layer between the fifth region and the first and second regions alinged in the lateral direction of the substrate;

a second gate conductor which is laid on the gate insulation layer and extends between the fifth region and the third and fourth regions aligned in the lateral direction of the substrate; a group of output-ground lines laid on one insulation layer and intersecting with the first and second gate conductors, said group including a first output-ground line having first and third contacts connected to the first and third regions, respectively, a second output-ground line having second and fourth contacts connected to the second and fourth regions, respectively and a third output-ground line having a fifth contact connected to the fifth region; and first, second, third and fourth MOS transistors formed between the fifth region and the first, second, third and fourth regions and having each a predetermined memory capacity of digital one bit.

BRIEF DESCRIPTION OF THE DRAWING

FIG. 5A is an IC pattern of one embodied read only memory according to this invention;

FIGS. 5B and 5C are cross sectional views of the read only memory shown in FIG. 5A, taken along line B—B and line C—C in FIG. 5A, respectively;

DETAILED DESCRIPTION OF THE PREFERRED EMBODIMENTS

Figure 1A:
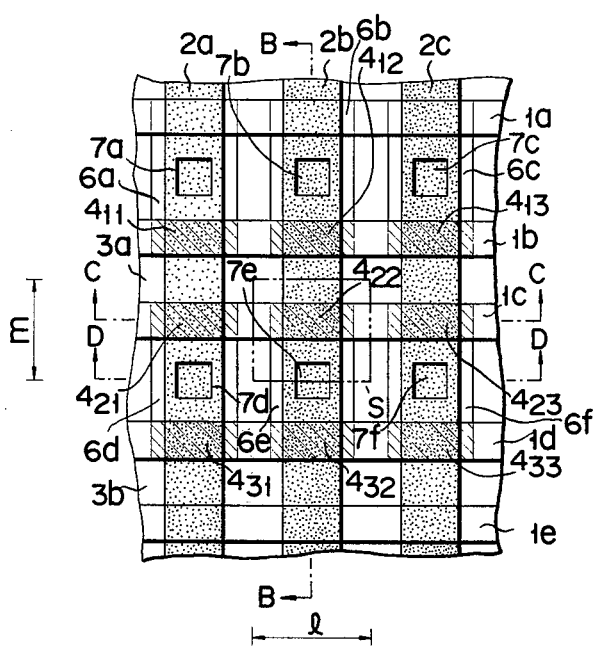
FIGS. 1A to 1D schmatically show a read only memory in which one ground line is used commonly for two gate lines.
Figure 1B:
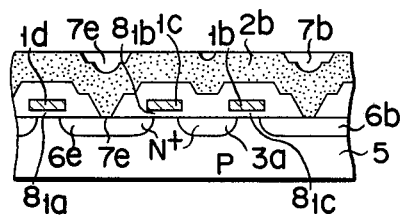
Figure 1C:
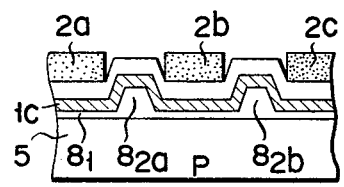
Figure 1D:
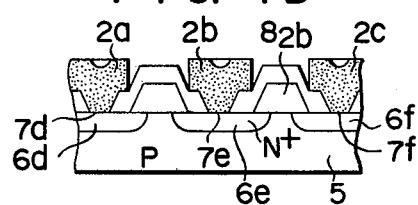
Figure 2:
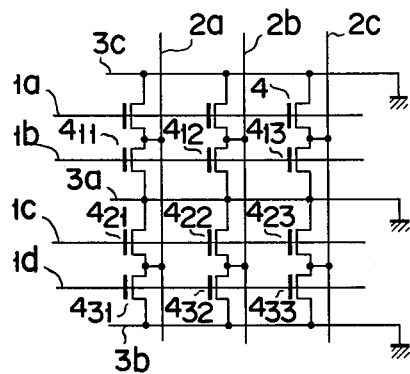
FIG. 2 is a circuit diagram of the read only memory shown in FIGS. 1A to 1D.
Figure 3A:
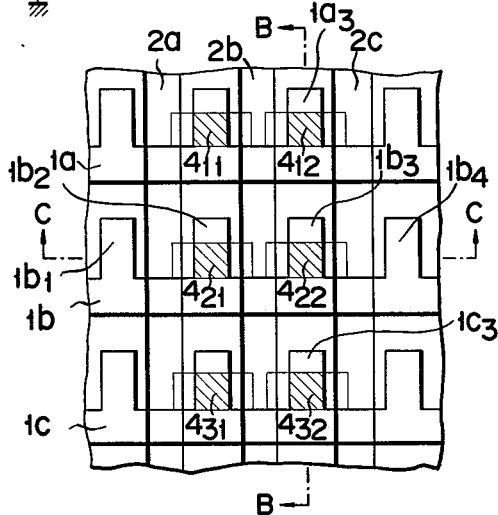
FIGS. 3A to 3C schmatically show a read only memory in which one of output lines is selected by a switching circuit and the output line adjacent to the selected output line is used as a ground line.
Figure 3B:
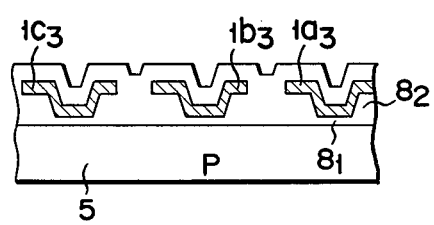
Figure 3C:
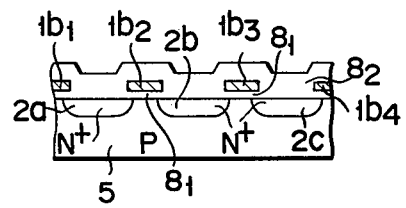
Figure 4A:
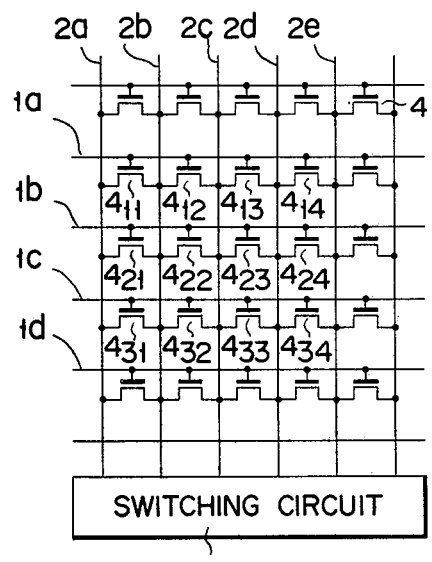
FIG. 4A is a circuit diagram of the read only memory shown in FIGS. 3A to 3C.
Figure 4B:
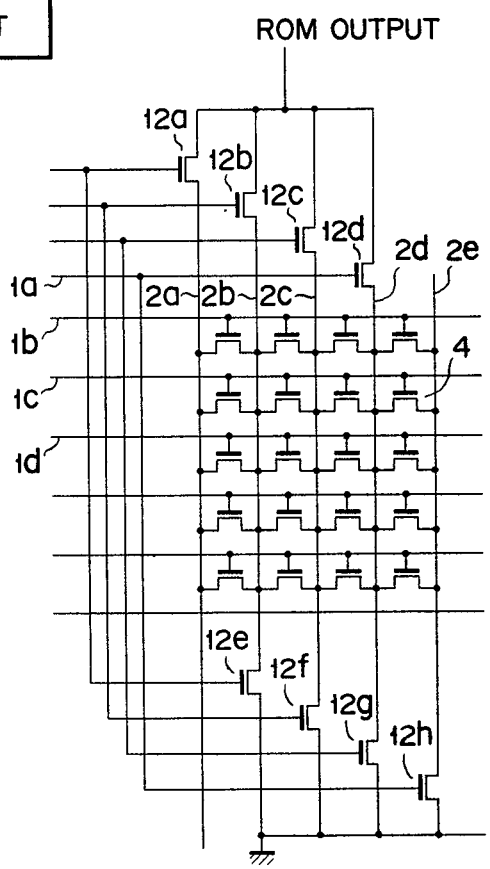
FIG. 4B is a circuit diagram of a read only memory which comprises an ROM section identical with that of FIG. 4A and a group of four output lines so connected as to read outputs of the ROM section.

As shown in FIGS. 5A to 5C, a read only memory according to this invention comprises a P-type silicon semiconductor substrate 21 and a plurality of rectangular N+-type diffusion layers $22_{11}$ to $22_{33}$ formed on one major surface of the substrate, parallel to one another with a predetermined space between them. The N+-type diffusion layers $22_{11}$, $22_{12}$, $22_{31}$ and $22_{32}$ are positioned at four corners of an imaginary rectangle $T_1$. At the center of the rectangle $T_1$ the N+-type diffusion layer $22_{21}$ is located. Further, the N+-type diffusion layers $22_{12}$, $22_{13}$, $22_{32}$ and $22_{33}$ are positioned at four corners of another imaginary rectangle $T_2$. At the center of the rectangle $T_2$ the N+-type diffusion layer $22_{22}$ is located. The N+-type diffusion layers $22_{21}$ and $22_{22}$ are positioned at upper two corners of another imaginary rectangle $T_3$. The N+-type diffusion layer $22_{32}$ at the lower-right corner of the rectangle $T_1$ is located also at the lower-left corner of the rectangle $T_2$ and at the center of the rectangle $T_3$.

In the read only memory of FIGS. 5A to 5C, four N+-type diffusion layers located at four corners of an imaginary rectangle and an N+-type diffusion layer located at the center of the imaginary rectangle constitute an MOS transistor block. Any adjacent MOS transistor blocks share some N+-type diffusion layers. The MOS transistor blocks are arranged in a regular pattern.

The surface of the P-type silicon substrate 21 is covered with thin gate oxide films $23_1$, field oxide films $23_2$ and thick gate oxide films $23_3$. These films $23_1$, $23_2$ and $23_3$ are made of insulative materials. On these films there are formed gate lines $24_1$, $24_2$, $24_3$ and $24_4$ made of polysilicon. The gate line $24_1$ extends along the upper sides of the N+-type diffusion layers $22_{11}$, $22_{12}$ and $22_{13}$ which are aligned with one another in the lateral direction of the substrate 21. The gate line $24_2$ extends along the lower sides of the layers $22_{11}$, $22_{12}$ and $22_{13}$ and along the upper sides of the N+-type diffusion layers $22_{21}$ and $22_{22}$ which are aligned with each other in the lateral direction of the substrate 21. The other gate lines $24_3$ and $24_4$ extend similarly along the sides of the N+-type diffusion layers and thus in the lateral direction of the substrate 21.

More precisely, for example, the gate line $24_1$ is formed on a thin gate oxide film $23_1$ which is located between the N+-type diffusion layers $22_{12}$ and $22_{22}$, and the gate line $24_3$ is formed on a thick gate oxide film $23_3$ which is located between the N+-type diffusion layers $22_{22}$ and $22_{32}$. The N+-type diffusion layers $22_{12}$ and $22_{22}$, the thin gate oxide film $23_1$ and the gate line $24_1$ constitute one MOS transistor $4_{13}$. Similarly, the N+-type diffusion layers $22_{22}$ and $22_{32}$, the thick gate oxide film $23_3$ and the gate line $24_3$ constitute an MOS transistor $4_{23}$. The gate oxide film $23_1$ is as thick as an ordinary active MOS transistor, and the gate oxide film $23_3$ is far thickner than an ordinary MOS transistor. Thus the MOS transistor $4_{13}$ functions as a memory cell for storing a "1" bit, and the MOS transistor $4_{23}$ is a so-called "inactive transistor" and acts as a memory cell for storing a "0" bit.

Thus, once the gate lines $24_1$ to $24_4$ have been formed on the gate oxide films $23_1$ and $23_3$ and field oxide films $23_2$, the contents of the MOS transistors (i.e. memory cells) are determined. Then, the major surface of the P-type silicon substrate 21 is covered entirely with a protective oxide film 27. On the protective oxide film 27 there are arranged output lines $25_1$ to $25_5$ at regular intervals to intersect with the gate lines $24_1$ to $24_4$. Each of the output lines $25_1$ to $25_5$ has contacts $26_{11}$ to $26_{33}$ which are connected to the N+-type diffusion layers $22_{11}$ to $22_{33}$, respectively.

As a result, between the N+-type diffusion layer $22_{21}$ located at the center of the imaginary rectangle $T_1$ and the N+-type diffusion layers $22_{11}$, $22_{12}$, $22_{31}$ and $22_{32}$ located at the corners of the rectangle $T_1$ there are formed four MOS transistors $4_{11}$, $4_{12}$, $4_{21}$ and $4_{22}$ each storing a "1" or "0" bit, the transistors $4_{11}$ and $4_{12}$ beneath the gate line $24_2$ and the transistors $4_{21}$ and $4_{22}$ beneath the gate line $24_3$. Similarly, between the N+-type diffusion layer $22_{22}$ located at the center of the imaginary rectangle $T_2$ and the N+-type diffusion layers $22_{12}$, $22_{13}$, $22_{32}$ and $22_{33}$ located at the corners of the rectangle $T_2$ there are formed four MOS transistors $4_{13}$, $4_{14}$, $4_{23}$ and $4_{24}$ each storing a "1" or "0" bit.

That surface area S of the substrate 21 indicated by double dot-dash line in FIG. 5A which is necessary for storing one bit is, for example:

$$S = l \times m = 14\ \mu m \times 20\ \mu m = 280\ \mu m^2.$$

Apparently, the area S occupied by one memory cell is much smaller than the area S in the ROM of FIG. 1A which is 340 μm². This is because the surface area of the substrate 21 is very effectively utilized. That is, the N+-type diffusion layers $22_{11}$ to $22_{33}$ which constitute the sources and drains of the MOS transistors $4_{11}$ to $4_{24}$ are displaced from one another for half pitch in both the lateral and longitudinal directions of the substrate 21 so that four MOS transistors are formed around one N+-type diffusion layer.

Further, the N+-type diffusion layers and the gate lines can be formed by a single impurity diffusion process since, as shown in FIG. 5A, the layers $22_{11}$ to $22_{33}$ are on one plane, and the gate lines $24_1$ to $24_4$ on a different plane. Only one impurity diffusion being required instead of two as in manufacturing the ROMs of FIGS. 1A to 1D, 3A to 3C and 4B, the ROM shown in FIGS. 5A to 5C is manufactured at a low cost.

Figure 6A:
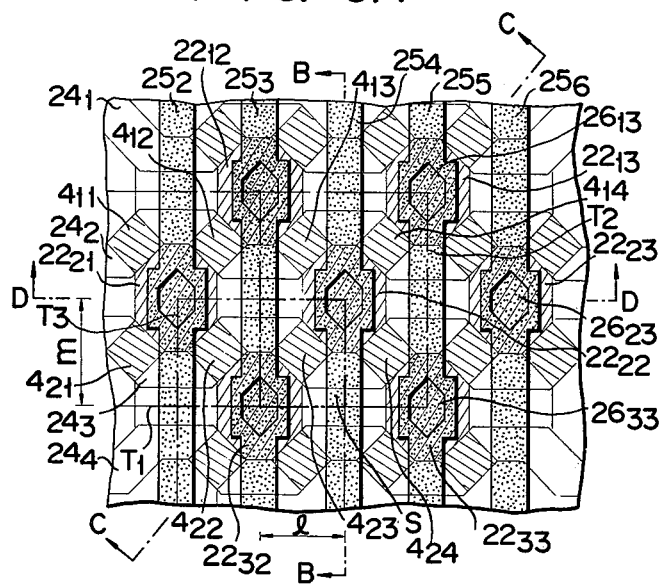
FIG. 6A is an IC pattern of another embodiment of this invention.

Another read only memory according to this invention is illustrated in FIGS. 6A to 6D, wherein the same or similar parts are denoted by the same reference numerals as used in the FIGS. 5A to 5C. In short, the ROM of FIGS. 6A to 6D differs from that of FIGS. 5A to 5C in that each N+-type diffusion layers is octagonal as shown in FIG. 6A. That is, the rectangular N+-type diffusion layers of the ROM shown in FIGS. 5A to 5C have their four corners cut off to become octagonal. As a result, the N+-type diffusion layers $22_{11}$ to $22_{33}$ can be positioned more close to one another, and gate lines $24_1$ to $24_4$ assume a meandering shape. Further, MOS transistors $4_{11}$ to $4_{24}$ are positioned slantwise with respect to output $25_2$ to $25_5$, at contacts $26_{12}$ to $26_{33}$, respectively.

Figure 6B:
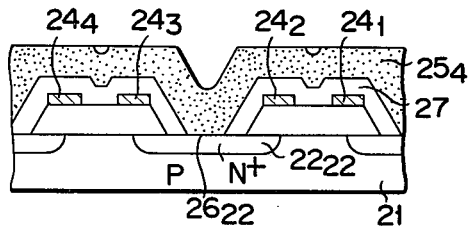
FIGS. 6B to 6D are cross sectional views of the read only memory shown in FIG. 6A, taken along line B—B, line C—C and line D—D in FIG. 6A, respectively.
Figure 6C:
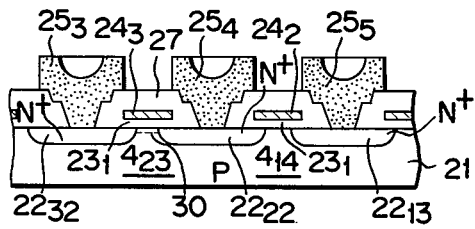
Figure 6D:
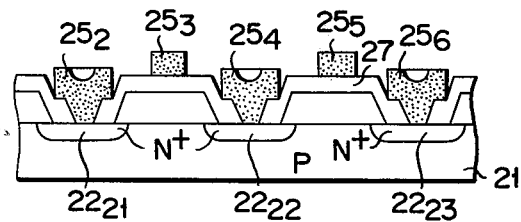

FIGS. 6B, 6C and 6D show the cross sections of the ROM of FIG. 6A, taken along line B—B, line C—C and line D—D in FIG. 6A. As shown in FIG. 6C, a gate oxide film $23_1$ is formed thin beneath a gate line $24_2$, thereby forming an active transistor $4_{14}$. In this respect the ROM is similar to the ROM shown in FIG. 5B. But it differs in that a P-type layer 30 is formed by, for example, ion-implantation between the N+-type diffusion layers $22_{22}$ and $22_{32}$, though a gate oxide film $23_1$ of an MOS transistor $4_{23}$ is as thick as the active transistor $4_{14}$. Since the P-type layer 30 is formed in such position, the MOS transistor $4_{23}$ becomes an inactive transistor. That is, the P-type layer 30 is formed on the channel portion of an MOS transistor so as to make the MOS transistor store a "0" bit permanently. Ion-implantation for forming the P-type layer 30 can be carried out much later than the forming of the thick gate oxide films $23_3$ in the ROM of FIGS. 5A to 5C. Thus almost all the ROM manufacture processes but ion-implantation may be carried out, and then the ion-implantation is carried out to cause desired MOS transistors to store "0" bits in accordance with the customers' instructions. In this way, the ROMs can be delivered to the customers in a shorter time after they have given instructions than the ROMs shown in FIGS. 5A to 5C.

Having such an IC pattern as shown in FIG. 6A, the ROM of FIGS. 6A to 6D has a higher IC density than the ROM shown in FIGS. 5A to 5C. The surface area S of the substrate 21 indicated by double dot-dash line occupied by each 1-bit memory cell is, for example:

$$S = l \times m = 14 \ \mu m \times 18 \ \mu m = 252 \ \mu m^2.$$

This invention is not limited to the above-described embodiments. For example, an N-type semiconductor substrate may be used instead of a P-type semiconductor substrate. Further, the gate lines and the output lines may be made of metals, not polysilicon. If these alternatives are made, the read only memory according to this invention remains advantageous in that the surface area of the substrate is very effectively utilized and that only one impurity diffusion process is required.

As described above, according to this invention the surface area of a semiconductor substrate is so effectively utilized as to elevate the IC density of a read only memory, and only one impurity diffusion process suffices to form diffusion layers and gate lines of polysilicon, thereby reducing the cost of the read only memory.

What is claimed is:

1. A read only memory having a semiconductor substrate of one conductivity type and a plurality of regions of the opposite conductivity type, the regions being arranged checkerwise on one major surface of the semiconductor substrate so as to form a plurality of MOS transistors displaced from one another for half pitch in both the lateral and longitudinal directions of the substrate, a first group of conductors laid on a first insulation layer in the lateral direction, and a second group of conductors laid on a second insulation layer in the longitudinal direction, each of the second group of conductors having contacts respectively connected to the regions of the opposite conductivity.

2. A read only memory having a semiconductor substrate of one conductivity type and a plurality of MOS transistor blocks of repeat pattern formed on one major surface of the semiconductor substrate, each of said MOS transistor blocks comprising:
   first, second, third and fourth regions of the opposite conductivity type which are formed at four corners of an imaginary rectangle;
   a fifth region of the opposite conductivity type which is formed substantially at the center of the imaginary rectangle and spaced from the first, second, third and fourth regions;
   a first gate conductor which is laid on a first insulation layer and extends between the fifth region and the first and second regions aligned in the lateral direction of the substrate;
   a second gate conductor which is laid on the first insulation layer and extends between the fifth region and the third and fourth regions aligned in the lateral direction of the substrate; and
   a group of conductive lines which are laid on a second insulation layer and intersect with the first and second gate conductors, said group including a first conductive line having first and third contacts connected to the first and third regions, respectively, a second conductive line having second and fourth contacts connected to the second and fourth regions, respectively and a third conductive line having a fifth contact connected to the fifth region; whereby
   first, second, third and fourth MOS transistors which are formed between the fifth region and the first, second, third and fourth regions and each of which has a predetermined memory capacity of digital one bit.

3. A read only memory according to claim 2, wherein said first insulation layer consists of thin gate oxide film portions for forming active MOS transistors and thick gate oxide film portions for forming inactive MOS transistors.

4. A read only memory according to claim 2, wherein said first, second, third, fourth and fifth regions are rectangular diffusion layers.

5. A read only memory according to claim 2, wherein said first, second, third, fourth and fifth regions are octagonal diffusion layers.

6. A read only memory having a semiconductor substrate of one conductivity type and a plurality of MOS transistor blocks formed on one major surface of the semiconductor substrate, each of said MOS transistor blocks comprising:

first, second, third and fourth regions of the opposite conductivity type which are formed at four corners of an imaginary rectangle;

a fifth region of the opposite conductivity type which is formed substantially at the center of the imaginary rectangle and spaced from the first, second, third and fourth regions;

a first gate conductor which is laid on a gate insulation layer and extends between the fifth region and the first and second regions aligned in the lateral direction of the substrate;

a second gate conductor which is laid on the gate insulation layer and extends between the fifth region and the third and fourth regions aligned in the lateral direction of the substrate;

a group of output-ground lines which are laid on an insulation layer and intersect with the first and second gate conductors, said group including a first output-ground line having first and third contacts connected to the first and third regions, respectively, a second output-ground line having second and fourth contacts connected to the second and fourth regions, respectively and a third output-ground line having a fifth contact connected to the fifth region; and suppression layers of the same conductivity type as the substrate which are formed selectively on the surface portions of the substrate between the fifth region and the first, second, third and fourth regions.

7. A read only memory according to claim 6, wherein said first, second, third, fourth and fifth regions are rectangular diffusion layers.

8. A read only memory according to claim 6, wherein said first, second, third, fourth and fifth regions are octagonal diffusion layers.

9. A read only memory according to claim 6, wherein said suppression layers are formed by ion-implantation.

* * * * *